United States Patent
Annowsky et al.

(10) Patent No.: US 8,587,324 B2
(45) Date of Patent: *Nov. 19, 2013

(54) DEVICE FOR TESTING HIGH-VOLTAGE EQUIPMENT

(75) Inventors: Rene Annowsky, Straussberg (DE); Andreas Thiede, Schoenborn (DE)

(73) Assignee: Maschinenfabrik Reinhausen GmbH, Regensburg (DE)

(*) Notice: Subject to any disclaimer, the term of this patent is extended or adjusted under 35 U.S.C. 154(b) by 0 days.

This patent is subject to a terminal disclaimer.

(21) Appl. No.: 13/143,382

(22) PCT Filed: Apr. 21, 2010

(86) PCT No.: PCT/EP2010/002426
§ 371 (c)(1),
(2), (4) Date: Sep. 28, 2011

(87) PCT Pub. No.: WO2010/139382
PCT Pub. Date: Dec. 9, 2010

(65) Prior Publication Data
US 2012/0139556 A1   Jun. 7, 2012

(30) Foreign Application Priority Data
Jun. 3, 2009 (DE) .................. 10 2009 023 713

(51) Int. Cl.
*G01R 31/06* (2006.01)
(52) U.S. Cl.
USPC ....................................... 324/547

(58) Field of Classification Search
None
See application file for complete search history.

(56) References Cited

U.S. PATENT DOCUMENTS

| | | | | |
|---|---|---|---|---|
| 3,555,291 A | * | 1/1971 | Dewey | 307/105 |
| 3,963,975 A | * | 6/1976 | Gauper et al. | 363/15 |
| 4,338,561 A | * | 7/1982 | Zaengl et al. | 324/551 |
| 5,859,529 A | * | 1/1999 | Baumgartl et al. | 323/361 |
| 5,949,662 A | * | 9/1999 | Boldin et al. | 307/66 |
| 6,396,279 B1 | * | 5/2002 | Gruenert | 324/424 |
| 8,410,790 B2 | * | 4/2013 | Thiede et al. | 324/547 |
| 2002/0057091 A1 | * | 5/2002 | Hensler et al. | 324/547 |
| 2003/0107904 A1 | * | 6/2003 | Guggisberg et al. | 363/40 |
| 2010/0259280 A1 | | 10/2010 | Thiede | |
| 2011/0121853 A1 | * | 5/2011 | Werle et al. | 324/757.01 |

FOREIGN PATENT DOCUMENTS

CH       688703 A5 *  1/1998 ............... H03H 7/09

* cited by examiner

*Primary Examiner* — Jermele M Hollington
(74) *Attorney, Agent, or Firm* — Andrew Wilford

(57) ABSTRACT

An apparatus for testing a high-voltage equipment transformer or inductor has a filter transformer having a primary side connectable to line and a secondary side and a grounded electrostatic shield between the primary and secondary sides. A static frequency converter has a plurality of inputs connected to the filter-transformer outputs and a plurality of outputs. Respective capacitors each have one side connected to a respective one of the converter outputs and an opposite side connected star-fashion to a common ground. A matching transformer has a plurality of inputs connected to the capacitors and a plurality of outputs connectable to the transformer or inductor to be tested.

5 Claims, 3 Drawing Sheets

Fig. 1 - Prior Art

DEVICE FOR TESTING HIGH-VOLTAGE EQUIPMENT

CROSS REFERENCE TO RELATED APPLICATIONS

This application is the US-national stage of PCT application PCT/EP2010/002426 filed 21 Apr. 2010, published 9 Dec. 2010 as WO2010/139382, and claiming the priority of German patent application 102009023713.5 itself filed 3 Jun. 2009.

FIELD OF THE INVENTION

The present invention relates to an apparatus for testing high-voltage equipment, in particular power transformers or inductors.

BACKGROUND OF THE INVENTION

In this context, it has proved to be advantageous to use static frequency converters instead of rotary converters because static frequency converters have clear advantages over rotary converters with respect to dynamic, wear, weight and availability. Frequency converters have to generate a sinusoidal symmetrical alternating current voltage that, in addition, has a distortion factor of less than 5%. For testing the insulation systems of power transformers, induced voltage testing is used in which partial discharge measurements are carried out. If highly inhomogeneous field distributions occur in high-voltage insulations or along air gaps, this can result in local exceeding the material-dependent breakdown field strength. In this state of an incomplete electrical breakdown, the insulation between the electrodes is only partially bridged by discharges. Such partial discharges occur primarily when the insulation is subjected to alternating current voltage. However, for a successful partial discharge measurement, the external acting interference must not exceed a partial discharge interference level of 100 µC. In order to ensure this, the respective outputs of the frequency converter are fed to a sine-wave filter that acts as low-pass filter.

However, a static frequency converter inherently generates a pulse-width-modulated rectangular output voltage with a high distortion factor that in this form is not suitable for testing power transformers. A sine-wave filter arranged at the output of the static frequency converter filters the fundamental wave between the outer conductors of the converter output and thus suppresses the symmetrical interference generated by the converter. Despite the additionally provided sine-wave filters, frequency-pulsed jumps of the conductor-ground voltage at the is converter output cannot be suppressed. These undesirable asymmetrical interference are conducted via different electrical coupling mechanisms far into the transformer being tested and cause considerable interference therein for the intended partial discharge measurement.

From the post-published application DE 10 2007 059 289 [US 2010/0259280] of the applicant, a generic test apparatus became known that suppresses the problem of asymmetrical interference by providing a static frequency converter that has a plurality of outputs connected to a filter whose outputs in turn are connected to a matching transformer that itself is connected to the test object, in particular a transformer, provided for the actual test. In this application it is proposed that the filter be a transformer that has an electrostatic shield between its primary and secondary sides and whose secondary-side outputs are connected to filter capacitors are connected together in a star connection with a grounded center. This arrangement for partial discharge measurement is possible in DE 10 2007 059 289 because the provided filter capacitor effects a potential separation on the load side between the frequency converter and the installed filter capacitors. In case of conventional sine-wave filters only composed of inductors connected in series and capacitors, the filter capacitors cannot be arranged in this manner because otherwise a capacitive converter phase-to-ground fault would occur.

However, as apparent from company publication 8.71/3, efforts have been made for some time to offer the customers mobile transformer testing systems so as to allow "on-site testing" of is high-power transformers with the systems. These mobile testing systems are installed in a container as prefabricated units and are driven with a transport carriage to the testing site or the location of the test object. On site, the completion of the finally required test circuit is possible in only a few steps. The benefit for the customer is the mobile availability of a single testing system for testing a plurality of permanently installed high-power transformers in different locations. The savings with respect to installation time and operating costs of such a mobile testing system are high compared to conventional stationary testing units. Thus, there is a correspondingly high demand for mobile testing systems that can be dimensioned in a more variable and stable manner with respect to the range of their testing capacities. However, the dimensioning with respect to the testing capacity is directly related to the total weight of the testing system. Since the latter, as already mentioned, is installed in a container, the total weight is governed by the road traffic regulations applicable in Germany and thus by legal restrictions with respect to the permissible total weight as well as the axle load distribution. In the international environment, there are similar restrictions with almost identical limit values. The mobile testing system known from company publication 8.71/3 exhausts the limits of the legally permissible total weights and axle load distributions to the greatest possible extent. The filter transformer installed in this model for suppressing asymmetrical interference has a capacity of 500 kVA. A significant increase of the testing capacity cannot be achieved with such a testing system.

OBJECT OF THE INVENTION

It is therefore the object of the invention to propose an apparatus for testing high-voltage equipment, in particular power transformers or inductors, which offers a significant increase of its achievable testing capacity compared to the prior art and is still usable as mobile transformer testing system.

SUMMARY OF THE INVENTION

This object is achieved by an apparatus for testing high-voltage equipment wherein the filter transformer is connected to the plurality of inputs of the static frequency converters such that the transformer effects a potential separation between a line and the filter capacitors thereby allowing a partial discharge measurement.

The general inventive idea is to shift the required potential separation for suppressing asymmetrical interference to the input side of the static frequency converter, thus to the line side. The previous potential separation on the load side by the filter transformer installed in the sine-wave filter required a relatively large transformer. The reason for this is that the parts of the static frequency converter on the line side are responsible only for the provision of the active power of the testing system. The parts of the static frequency converter on the load side, moreover, has to be able to provide the high reactive power required for the testing. Therefore, the parts of the static is converter on the load side are usually dimensioned for a higher capacity than the one on the line side (typically 40% capacity on the line side, 100% capacity on the load side). In case of a significant increase of the apparent power on the load side, a correspondingly large filter transformer would have to be used. In this case, the testing system would no longer be roadworthy with respect to the permissible total weights and axle load distributions governed by the road traffic regulations. By shifting, according to the invention, the potential separation to the line side of the static frequency converter, a mobile testing system having an equivalent effectiveness and comprising a transformer that only has to be dimensioned according to the active power is sufficient. Therefore, with this measure, the conformity of the permissible total weight and axle load distribution can be ensured in a particular simple and effective manner.

Thus, the actual filter no longer consists of a filter transformer and grounded filter capacitors interconnected in a star connection as known from DE 10 2007 059 289.4-35, but consists only of inductors connected in series to the outputs of the static frequency converter followed by grounded filter capacitors connected in a star connection that filters out asymmetrical interference between the outer conductors and ground. This filtering is possible only because of the potential separation of the transformer used on the line side. Here, between primary and secondary sides of the transformer used on the line side, a grounded electrostatic shield is provided that also contributes to the dissipation of asymmetrical interference.

It is advantageous if the static frequency converter, the transformer on the line side, and the load-side sine-wave filter with the filter capacitors interconnected in star connection are enclosed in a control cabinet so that no asymmetrical interference reach the transformer subjected to the test.

According to a preferred embodiment, in addition to the star-connected filter capacitors, the filter comprises further delta-connected capacitors that filter the symmetrical interference between the outer conductors.

By shifting, according to the invention, the transformer for the testing system to the line side, the entire installation has a total weight that is significantly reduced with respect to the prior art. Moreover, with the new testing system, the passive compensation unit can also be eliminated to further contribute to the weight reduction.

However, the present invention is not limited to mobile transformer testing systems. In fact, it is also conceivable to apply the general inventive idea, namely to shift the transformer to the supply or line side, also to a stationary transformer testing apparatus.

BRIEF DESCRIPTION OF THE DRAWING

The invention is illustrated in more detail below by way of example and with reference to the drawings. Therein.

DETAILED DESCRIPTION

Figure 1:
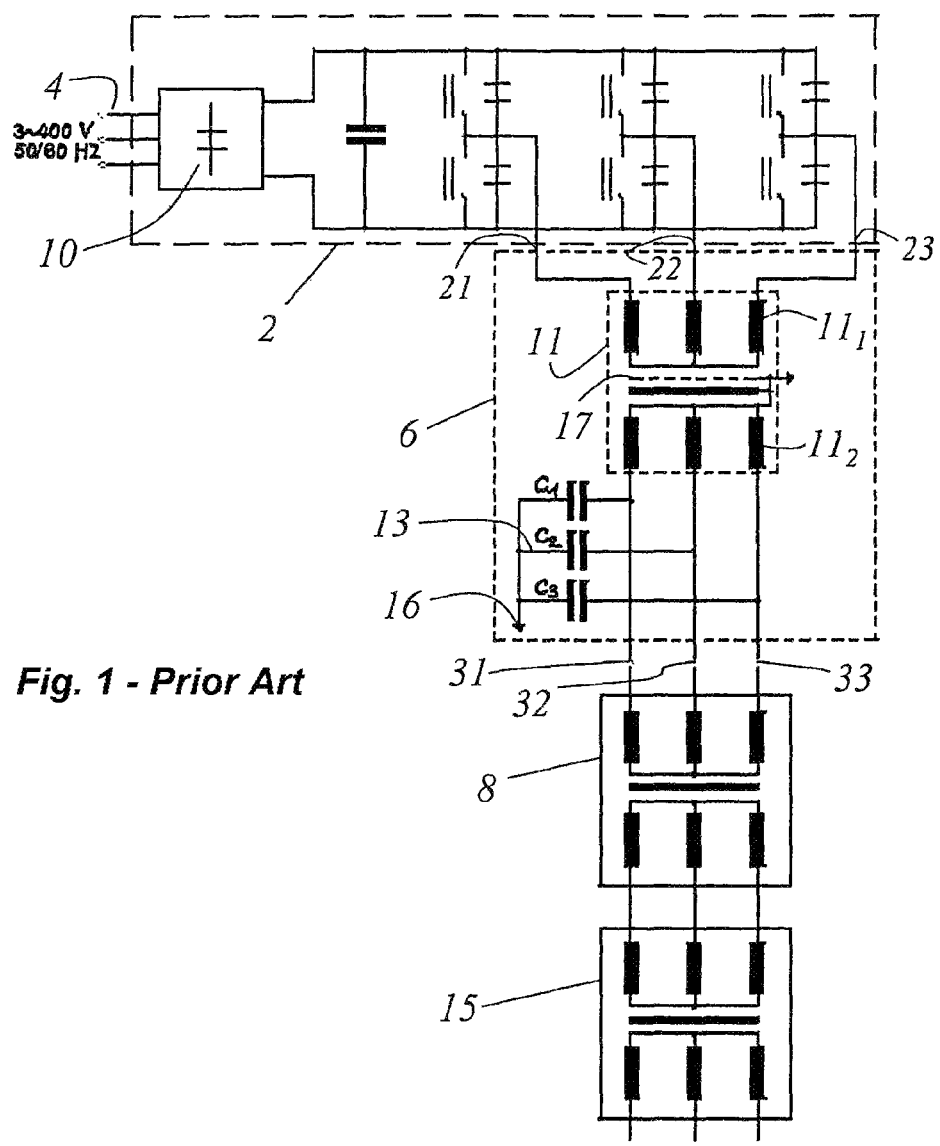
FIG. 1 shows a prior-art post-published circuit diagram of a transformer testing system.

FIG. 1 is a circuit diagram of an apparatus for testing high-voltage equipment, which diagram is described in DE 10 2007 059 289, but not pre-published. A static frequency converter 2 is supplied from line 4 with alternating current voltage that arrives first at a rectifier 10. In addition, the frequency converter 2 has a first output 21, a second output 22 and a third output 23. The static frequency converter 2 is a voltage intermediate circuit converter with a digital control and closed-loop control. The outputs 21, 22 and 23 of the static frequency transformer 2 are fed to a filter 6, in particular to a primary side $11_1$ of a filter transformer 11. The filter transformer 11 comprises the primary side $11_1$ and a secondary side $11_2$. The secondary side $11_2$ of the filter transformer 11 is connected to the filter capacitors C1, C2 and C3 that are arranged in a star connection 13. The star point resulting from the star connection, in turn, is connected to ground 16. The filter transformer 11 generates a potential separation between the outputs 21 to 23 of the frequency converter and the capacitors C1 to C3 of the star connection 13.

In addition, there is a grounded electrostatic shield 17 between the primary side $11_1$ and the secondary side $11_2$ of the filter transformer 11. The filter 6, consisting of the filter transformer 11 and the star connection 13 of the filter capacitors C1 to C3 has a first output 31, a second output 32 and a third output 33 connected to a matching transformer 8, and the latter, in turn, is connected to a transformer 15 to be tested.

Figure 2:
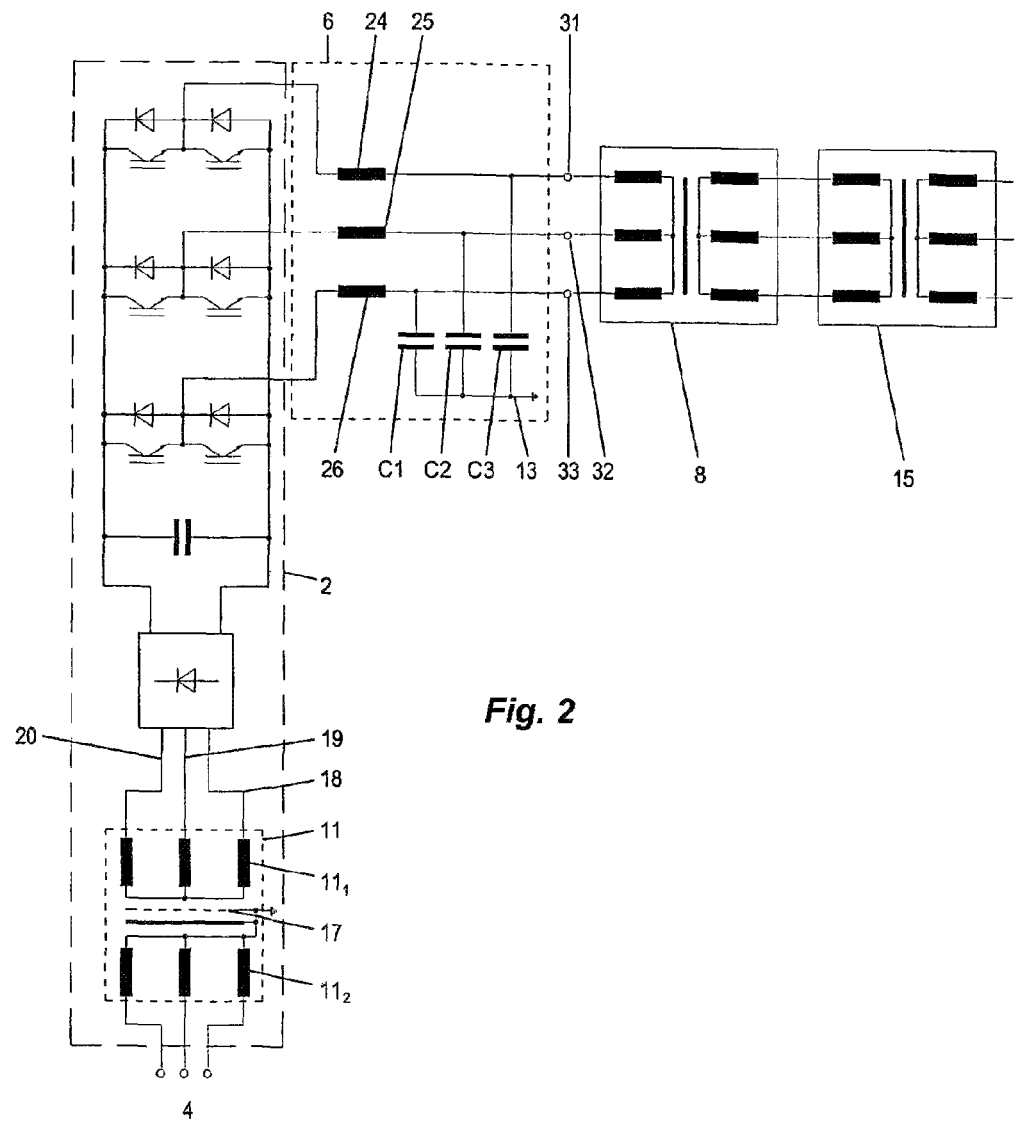
FIG. 2 is a circuit diagram of an apparatus according to the invention.

By shifting, according to the invention, the filter transformer 11 previously on the load side to the input side of the line 4, as illustrated in FIG. 2, clear advantages are achieved not only with respect to the weight of the individual components of the testing system; experimental setups have shown that with the testing system according to the invention, a better suppression of the partial discharge interference generated by the static frequency converter is possible.

In contrast to FIG. 1, the secondary side $11_2$ of the transformer 11 in FIG. 2 is now connected to the inputs 18, 19, and 20 of the static frequency converter 2. Here, the primary side $11_1$ of the transformer 11 is supplied with alternating current voltage from the line 4. Furthermore, between the primary side $11_1$ and the secondary side $11_2$, a grounded electrostatic shield 17 is provided that contributes in addition to the dissipation of asymmetrical interference. In addition, the transformer 11 provides for the potential separation that is necessary for an interference-free partial discharge measurement. As described, the secondary side $11_2$ of the transformer 11 is connected to the inputs 18, 19 and 20 of the static frequency converter 2 that provides for the required output voltage and the different required test frequencies. The outputs 21, 22 and 23 of the frequency 2 are connected within the filter 6 to respective inductors 24, 25 and 26 and that are in turn connected to the respective grounded filter capacitors C1, C2 and C3 that are interconnected in the star connection [13]. The outputs 31, 32 and 33 of the filter 6 are connected to a matching transformer 8 that, in turn, is connected to the high-voltage equipment to be tested, in this case a power transformer [15].

Figure 3:
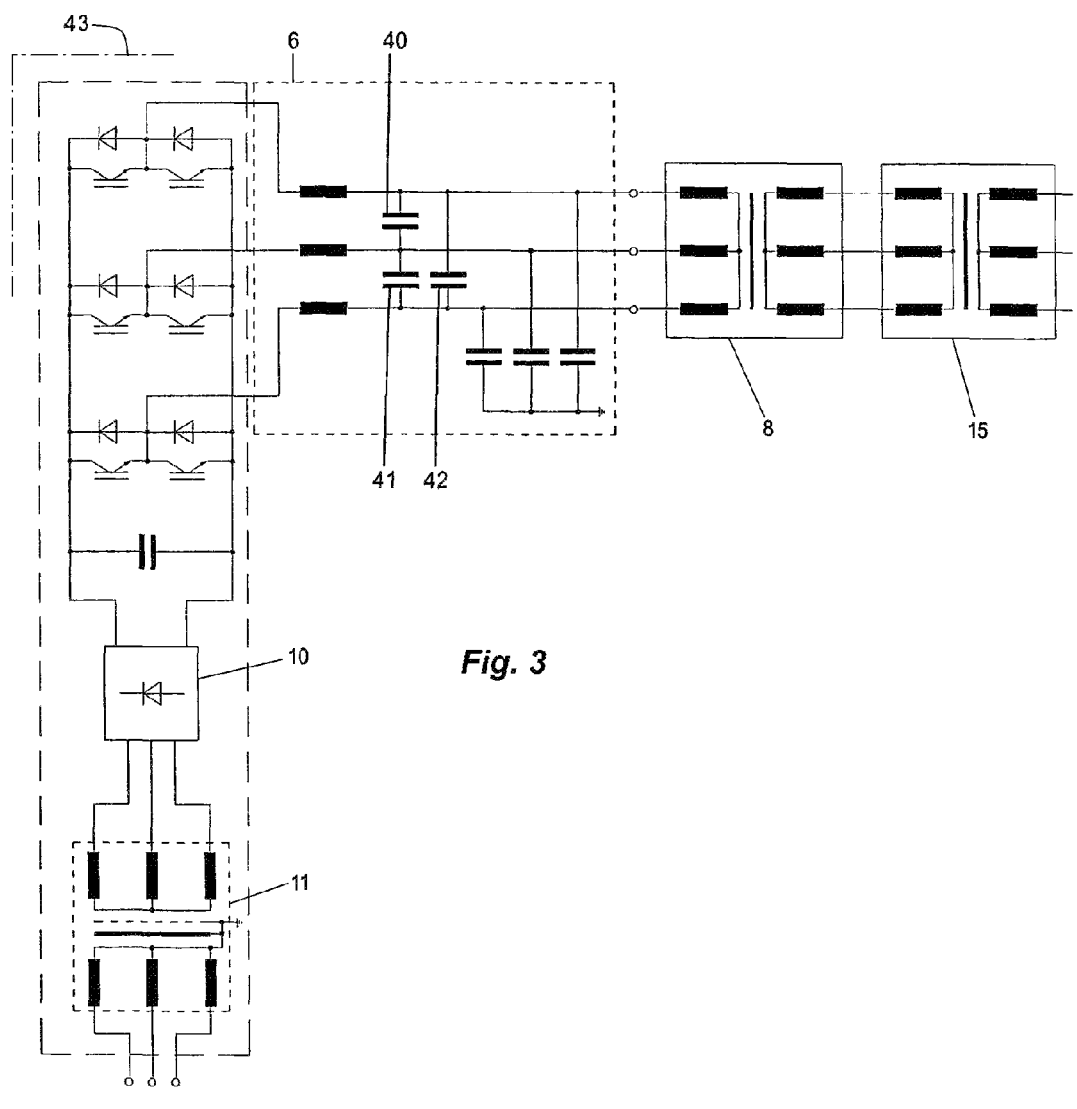
FIG. 3 shows a preferred embodiment of the invention with additional filter capacitors.

In the filter 6 in FIG. 3, additional filter capacitors 40, 41 and 42 are provided that are interconnected in a star connection and filter out symmetrical disturbances between the outer conductors. In addition a cabinet shown schematically at 43 contains the circuit elements of the test apparatus.

The invention claimed is:
1. An apparatus for testing high-voltage power transformers or inductors, the apparatus having
a filter transformer having a primary side and a secondary side between which is provided a grounded electrostatic shield,
a static frequency converter having a plurality of outputs connected to a filter having filter capacitors that are interconnected in a star connection with a grounded star point, a plurality of outputs of the filter being connected to a matching transformer, and the matching transformer in turn being connected with a transformer to be tested, wherein the filter transformer is connected to the plurality of inputs of the static frequency converters such that the transformer effects a potential separation between a line and the filter capacitors thereby allowing a partial discharge measurement.

2. The apparatus according to claim 1, wherein inductors connected in series within the filter are connected to the outputs of the static frequency converter.

3. The apparatus according to claim 1, wherein the filter has additional filter capacitors that are connected in a star connection.

4. The apparatus according to claim 1, wherein the static frequency converter and the transformer on the line side together with the inductors and the filter capacitors are accommodated in a control cabinet so that no asymmetrical interference can reach the transformer subjected to the test.

5. An apparatus for testing a high-voltage equipment transformer or inductor, the apparatus comprising:
- a filter transformer having a primary side connectable to line and a secondary side and a grounded electrostatic shield between the primary and secondary sides;
- a static frequency converter having a plurality of inputs connected to the filter-transformer outputs and a plurality of outputs;
- respective capacitors each having one side connected to a respective one of the converter outputs and an opposite side connected star-fashion to a common ground; and
- a matching transformer having a plurality of inputs each connected to a respective one of the frequency-converter outputs and a plurality of outputs connectable to the transformer or inductor to be tested.

* * * * *